(12) United States Patent
Körner et al.

(10) Patent No.: US 12,712,514 B2
(45) Date of Patent: Aug. 18, 2026

(54) EMC FILTER DEVICE HAVING AN INTEGRATED CURRENT SENSOR AND AN INTEGRATED CAPACITOR; AND POWER ELECTRONICS MODULE

(71) Applicant: Schaeffler Technologies AG & Co. KG, Herzogenaurach (DE)

(72) Inventors: Julian Körner, Karlsruhe (DE); Linbo Tang, Baden-Baden (DE); Eduard Enderle, Gengenbach (DE); Bao Ngoc An, Karlsruhe (DE); Momo Lažetic, Žilina (SK); Mihai Cretu, Kappelrodeck (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 168 days.

(21) Appl. No.: 18/288,081

(22) PCT Filed: Apr. 29, 2022

(86) PCT No.: PCT/DE2022/100320
§ 371 (c)(1),
(2) Date: Oct. 24, 2023

(87) PCT Pub. No.: WO2022/228617
PCT Pub. Date: Nov. 3, 2022

(65) Prior Publication Data

US 2024/0195379 A1 Jun. 13, 2024

(30) Foreign Application Priority Data

Apr. 29, 2021 (DE) ..................... 10 2021 110 986.8

(51) Int. Cl.
*H03H 7/01* (2006.01)
*H05K 1/02* (2006.01)
*H05K 1/14* (2006.01)

(52) U.S. Cl.
CPC ......... *H03H 7/0115* (2013.01); *H05K 1/0243* (2013.01); *H05K 1/144* (2013.01);
(Continued)

(58) Field of Classification Search
CPC .... H03H 7/0115; H05K 1/0243; H05K 1/144; H05K 2201/042; H05K 2201/10015;
(Continued)

(56) References Cited

U.S. PATENT DOCUMENTS 6,208,098 B1 * 3/2001 Kume .................. H02M 1/126 318/803
7,567,446 B2 * 7/2009 Sugino .................. H02M 7/003 363/39
(Continued)

FOREIGN PATENT DOCUMENTS

CN 107306079 B * 7/2023 .............. H02M 1/44
DE 102004013477 A1 10/2005
(Continued)

*Primary Examiner* — Andrea Lindgren Baltzell
*Assistant Examiner* — Kimberly E Glenn
(74) *Attorney, Agent, or Firm* — Price Heneveld LLP

(57) ABSTRACT

An EMC filter device for power electronics of an electric machine includes an electrical conductor structure having at least two separate conducting layers that are insulated from one another; an inductor that cooperates with the electrical conductor structure; and a plurality of additional electronic components fastened to the electrical conductor structure.

14 Claims, 4 Drawing Sheets

(52) U.S. Cl.
CPC .................. *H05K 2201/042* (2013.01); *H05K 2201/10015* (2013.01); *H05K 2201/10022* (2013.01); *H05K 2201/1003* (2013.01); *H05K 2201/1006* (2013.01)

(58) Field of Classification Search
CPC . H05K 2201/10022; H05K 2201/1003; H05K 2201/1006; H05K 1/053; H05K 1/0203; H02M 1/04; H02M 7/003; H01F 2017/065; H01F 2027/065; H01F 17/06
See application file for complete search history.

(56) References Cited

U.S. PATENT DOCUMENTS

| | | | | |
|---|---|---|---|---|
| 11,849,537 | B2 * | 12/2023 | Pardo Peris | H03H 7/427 |
| 2011/0043303 | A1 * | 2/2011 | Herron | H05K 1/0233 333/185 |
| 2018/0049314 | A1 * | 2/2018 | Amaducci | H05K 7/14329 |
| 2018/0269781 | A1 | 9/2018 | Amaducci | |

FOREIGN PATENT DOCUMENTS

| | | | | |
|---|---|---|---|---|
| DE | 102010030917 | A1 | 4/2011 | |
| DE | 202016104468 | U1 | 8/2016 | |
| DE | 202016105142 | U1 | 12/2016 | |
| DE | 102015219643 | A1 | 4/2017 | |
| DE | 102017120924 | A1 | 3/2019 | |
| DE | 102020206199 | A1 | 11/2021 | |
| DE | 102022132448 | A1 * | 6/2024 | H02J 1/02 |

* cited by examiner

EMC FILTER DEVICE HAVING AN INTEGRATED CURRENT SENSOR AND AN INTEGRATED CAPACITOR; AND POWER ELECTRONICS MODULE

CROSS-REFERENCE TO RELATED APPLICATIONS

This application is the U.S. National Phase of PCT Appln. No. PCT/DE2022/100320 filed Apr. 29, 2022, which claims priority to DE 102021110986.8 filed Apr. 29, 2021, the entire disclosures of which are incorporated by reference herein.

TECHNICAL FIELD

The present disclosure relates to an EMC filter device for power electronics of an electric machine, preferably an electric machine used as a drive unit in a motor vehicle.

SUMMARY

The present disclosure provides, according to an exemplary embodiment, a filter device that functions as reliably as possible in the sense of a mains filter for use in a power electronics, which on the one hand has a structure that is as compact as possible, in particular flat, and on the other hand is equipped with as few interfaces/contacts as possible.

An EMC filter device for power electronics of an electric machine has an electric conductor structure and at least one inductor interacting with the conductor structure, wherein the conductor structure has at least two separate conducting layers, and wherein additional electronic components are fastened onto the conductor structure. The conductor structure is thus designed, for example, as a laminated busbar or high-current printed circuit board.

The abbreviation "EMC" used herein stands for "electromagnetic compatibility". Accordingly, an EMC filter device is a filter device that ensures or improves the electromagnetic compatibility of a device, for example a power electronics module, to which the filter device is coupled.

Due to the compact design thereof, this EMC filter device according to the present disclosure can be integrated more easily into existing installation spaces, for example, in a housing of an inverter unit, or the inverter unit can be designed to be more compact overall. By providing additional electronic components on the conductor structure, the structure is realized as compactly as possible on the one hand, and on the other hand the necessary fastening and contact points are significantly reduced.

Accordingly, it is also advantageous if the electronic component is attached to the conductor structure in a materially bonded manner, for example, welded, soldered, or glued on. This reduces the assembly effort.

If a first electronic component is in the form of a capacitor placed on (for example on an upper side of) the conductor structure, wherein more preferably several of these first electronic components are provided, the design of the filter device is kept as simple as possible.

Furthermore, it is advantageous if a second electronic component is designed as a current sensor fastened to the conductor structure.

A third electronic component can be embodied as a discharge resistor fastened to the conductor structure. As a result, the structure of the filter device is also kept as compact as possible and the functionality is expanded.

If an insulating film is arranged between the individual conducting layers of the conductor structure, the conductor structure is constructed as compactly as possible.

In this regard, it is also expedient if the conductor structure is surrounded/encased in the entirety thereof outwardly/on the outside by an insulating film.

It is also advantageous if the at least one inductor has a core (for example designed as a ring core) and the conductor structure is inserted into/projects through this core. This also results in an arrangement that is as compact as possible.

Furthermore, the present disclosure relates to a power electronics module for an electric machine, having a capacitor arrangement and an EMC filter device according to the present disclosure, which is electrically connected to the capacitor arrangement, according to at least one of the previously described embodiments.

It has also turned out to be advantageous if the conductor structure is fastened to a region of the capacitor arrangement which is fixed to a housing. As a result, the housing region/a housing of the power electronics module can be used directly to house the EMC filter device, as a result of which further installation space is saved.

Furthermore, it is expedient if multiple capacitors in the capacitor arrangement are also fastened to an upper side or an underside of the conductor structure. In this case, the conductor structure can have a corresponding extension on which the individual capacitors are arranged in series and/or in parallel with one another. As a result, the conductor structure is used even more skillfully for a compact design of the power electronics module.

It is also advantageous if a current input of the power electronics module is formed directly by the conductor structure and a current output of the power electronics module is formed by the capacitor arrangement.

In other words, an EMC filter (EMC filter device) having an integrated current sensor and DC link capacitor (capacitors) is thus formed according to the present disclosure. The EMC filter is formed using a laminated busbar (/a current laminated busbar/busbar/conductor structure). The laminated busbar has at least two electrically conducting layers that are insulated from one another. The additional components, in particular a current sensor and/or a discharge resistor, are connected to the laminated busbar.

BRIEF DESCRIPTION OF THE DRAWINGS

In the following, the present disclosure is now explained in more detail with reference to figures.

In the figures.

The drawings are only schematic in nature and serve only for understanding the present disclosure. The same elements are provided with the same reference symbols.

DETAILED DESCRIPTION

Figure 1:
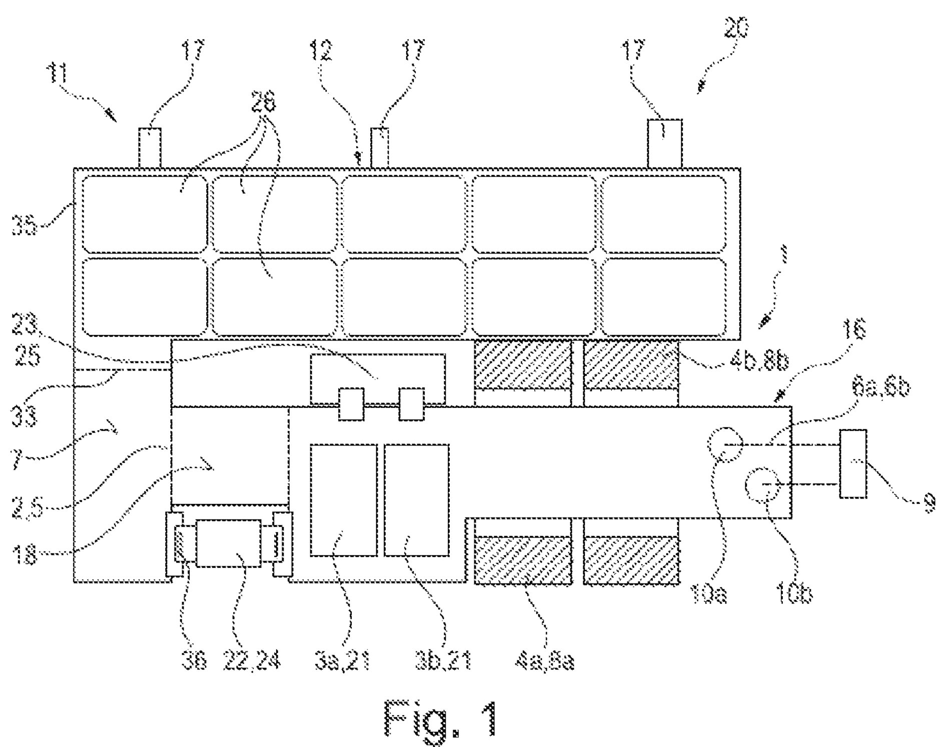
FIG. 1 shows a plan view of an EMC filter device according to the present disclosure according to an exemplary embodiment as part of an inverter unit/a power electronics module.

FIG. 1 shows an EMC filter device 1 according to the present disclosure. In this embodiment, the EMC filter device 1 is implemented as an independent module, but in further embodiments according to the present disclosure it is also directly designed as a component of a power electronics module 20/an inverter unit 11. The inverter unit 11 then in turn forms a component of the power electronics module 20 indicated generally in FIG. 1/a power electronics for an electric machine. The EMC filter device 1 is thus used in a power electronics of an electric machine of a motor vehicle, which is preferably designed as a drive machine.

Figure 2:
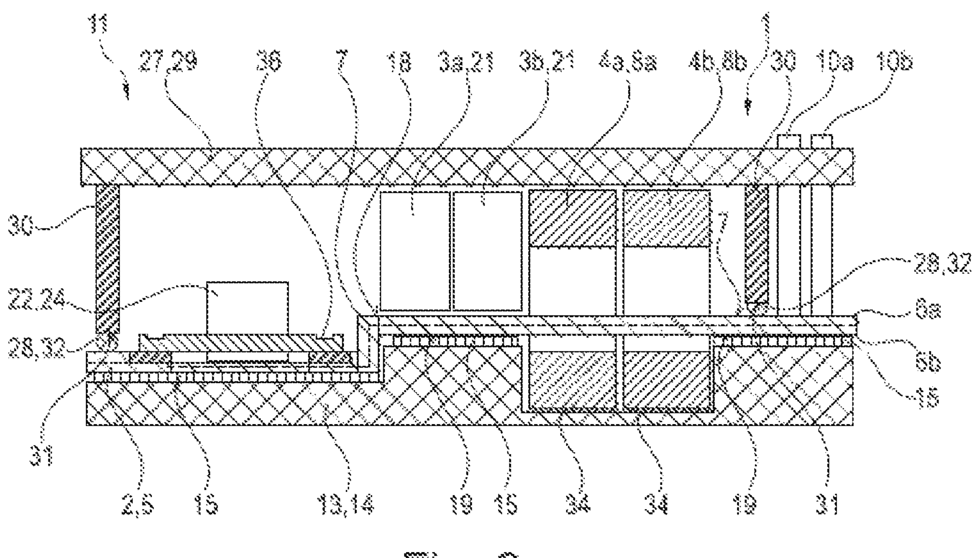
FIG. 2 shows a cross-sectional illustration of the EMC filter device according to FIG. 1, so that a heat-conducting layer arranged between a conductor structure and a region fixed to the housing and two side walls serving for shielding can be seen.

As can also be seen in more detail in FIG. 2, the EMC filter device 1 has a laminated conductor structure 2 which is implemented here as a laminated busbar 5. In further embodiments, the conductor structure 2 is also implemented as a printed circuit board, namely as a high-current printed circuit board. The conductor structure 2, which is alternatively also referred to as a busbar or current laminated busbar, has multiple conducting layers 6*a*, 6*b*, which are indicated in FIG. 2 and are insulated from one another. The conducting layers 6*a*, 6*b* lie flat/coplanar on one another and form the conductor structure 2/busbar 5 as a whole. Between the conducting layers 6*a*, 6*b*, as also indicated in FIG. 2, an insulating film 7 is interposed, which is used directly to insulate the two conducting layers 6*a*, 6*b* relative to one another. The conductor structure 2, i.e., the entirety of conducting layers 6*a*, 6*b*, is also sealed from the outside thereof by such an insulating film 7. In further embodiments, the conductor structure 2 also consists of more than two, for example three or four, conducting layers 6*a*, 6*b*.

The conductor structure 2 has an essentially plate-shaped construction. According to the design as an EMC filter device 1, the conductor structure 2 has two inductors 4*a*, 4*b*. A first inductor 4*a* has a first core 8*a*, and a second inductor 4*b* has a second core 8*b*. Each core 8*a*, 8*b* is designed as a toroidal core/ring-shaped. A section of the conductor structure 2 extends centrally through these cores 8*a*, 8*b* which are arranged adjacent to one another.

Two connections 10*a*, 10*b* are implemented on the conductor structure 2 towards a common side of both inductors 4*a*, 4*b*, and form a current input during operation. The two terminals 10*a*, 10*b* are connected to a power supply 9, preferably a high-voltage battery, during operation, as also indicated. The two connections 10*a*, 10*b* form not only a current input of the EMC filter device 1, but also a current input 16 of the inverter unit 11 and the power electronics module 20.

Furthermore, two capacitors 3*a*, 3*b* in the form of capacitors are placed/applied to the conductor structure 2. The two capacitors 3*a*, 3*b* thus form two first electronic components 21 which are housed in/fastened to the conductor structure 2. The respective first electronic component 21 can be fixed in a materially bonded manner to the conductor structure 2, for example soldered or welded thereto.

Another second electronic component 22, which is housed in/fastened to the conductor structure 2, is implemented as a current sensor 24 and is therefore used to detect an electric current (FIGS. 1 and 2). The current sensor 24 is attached to the conductor structure 2 via a weld point 36.

Furthermore, a third electronic component 23 in the form of a discharge resistor 25 is housed in/fastened to the conductor structure 2 (FIG. 1). The third electronic component 23 can also be fixed to the conductor structure 2 in a materially bonded manner.

As an alternative to the form-fit connection of the respective component 21, 22, 23, another connection of the respective component 21, 22, 23 is also provided in further embodiments, for example force-fit via fastening means such as screws.

FIG. 1 also shows that the conductor structure 2 is connected to a capacitor arrangement 12 of the inverter unit 11. A corresponding connection takes place, for example, in the region of a dividing line 33. In a further exemplary embodiment, however, the conductor structure 2 is also formed in one piece with a busbar 35 of the capacitor arrangement 12, so that multiple capacitors 26 of the capacitor arrangement 12 are also arranged on the conductor structure 2. The EMC filter device 1 is then a direct component of an inverter unit 11 having the capacitor arrangement 12. The capacitors 26 are implemented as discrete capacitors 26 and are arranged in two parallel rows, for example.

The inverter unit 11 has a housing 13, which is also referred to as an inverter housing. This housing 13 encloses both the capacitor arrangement 12 and the EMC filter device 1 with the conductor structure 2. However, it should again be pointed out that in further embodiments, the EMC filter device 1 has its own housing, which is then fixedly attached to the housing 13 and can therefore be referred to as a region 14 of the housing 13 which is fixed to the housing.

In this respect, it can be seen in FIG. 2 that the conductor structure 2 with the electronic components 21, 22, 23 thereof and the inductors 4*a*, 4*b* is placed on the region 14 of the housing 13 which is fixed to the housing. The region 14 which is fixed to the housing is implemented here directly as a plate-shaped region of the housing 13. In further embodiments, the region 14 which is fixed to the housing is also designed in a different way as a heat sink, which is further connected to the housing 13.

FIG. 2 also shows that there is a cover 29 which, together with the region 14 fixed to the housing, houses the EMC filter device 1. When viewed in the plane of the drawing, the conductor structure 2 rests with the underside 19 thereof (here indirectly) on the region 14 fixed to the housing. The electronic components 21, 22, 23 are attached to the upper side 18 thereof. In other versions, these are partially or entirely attached to the underside 19.

Furthermore, the two cores 8*a*, 8*b* are connected to the region 14 fixed to the housing via an adhesive connection 34. It can also be seen here that the two connections 10*a*, 10*b* are implemented as what are termed pins and protrude at least through the cover 29.

It should also be pointed out that in a further exemplary embodiment a covering 27 which forms a shield is also formed by the cover 29. The covering 27 is formed by the cover 29 and a side wall 30 fastened to the cover 29. The cover 29 and side wall 30 thus form a shielding hood which is placed on the conductor structure 2 and is supported on the latter via the side walls 30.

In this regard, it can also be seen in FIG. 2 that an EMC seal 28 is interposed between an end face 31 of the side walls 30 and the conductor structure 2/the upper side 18 of the conductor structure 2. This EMC seal 28 has a sealing strip 32 or is implemented as such a sealing strip 32. The EMC seal 28 extends over the entire circumference of the side wall 30 and thus seals off an interior of the covering 27 from the environment.

The side walls 30 are formed separately from the cover 29 and are attached/fastened thereto. For example, the side wall 30 is welded to the cover 29 or attached in a force-fit manner, for example by means of fastening means. In further embodiments, however, the side walls 30 are also designed as a one-piece material component of the cover 29.

It can also be seen from FIG. 2 that a thermally conducting layer 15, which is implemented as a "gap pad"/mat, is inserted between the conductor structure 2 and the region 14 fixed to the housing. The layer 15 thus serves to dissipate waste heat from the conductor structure 2 in the direction of the region 14 fixed to the housing. The layer 15 is elastically deformable and inserted in a compressed manner between the conductor structure 2 and the region 14 fixed to the housing. The layer 15 consists of a certain thermally conductive material, such as a thermally conductive filled composite. In further embodiments, the layer 15 is alternatively implemented as a gel layer or as a casting composite.

While the connections 10*a*, 10*b*, as already mentioned, form the overall current input 16 of the inverter unit 11/of the power electronics module 20, an output of the capacitor arrangement 12 typically forms a current output 17 of the inverter unit 11/of the power electronics module 20, which is indicated schematically in FIG. 1.

In other words, according to the present disclosure, an EMC filter 1 is constructed on the basis of a current laminated busbar (laminated busbar 5).

In this EMC filter 1, further components 21, 22, 23, such as current sensor 24 and discharge resistor 25, can be connected to the current laminated busbar 5.

In one embodiment, the additional components 21, 22, 23 can be screwed or welded (laser welding) onto the current laminated busbar 5.

The intermediate circuit capacitor (capacitor arrangement 12) is constructed on the basis of discrete capacitors 26 which are connected in parallel via the current laminated busbar 5. This intermediate circuit capacitor is directly connected to the EMC filter 1 via the common current laminated busbar 5.

The current laminated busbar 5 consists of two or more coplanar conductive plates (e.g., copper plates: also referred to as conducting layers 6*a*, 6*b*) laminated with the insulating foils 7 in between and outside.

The passive components (e.g., capacitors) can be soldered directly onto the current laminated busbar 5. Current sensor 24 (DC side) and discharge resistor 25 can be connected directly to the current laminated busbar 5 (e.g., by means of laser welding).

In one embodiment, a DC link capacitor can be connected as a parallel connection of discrete capacitors (capacitors 3*a*, 3*b*) via the current laminated busbar 5.

The current laminated busbar 5 is placed close to the housing 13 and thermally connected to the inverter housing 13 via thermally conductive materials (e.g., gap pad).

The cores 8*a*, 8*b* are placed in the inverter housing 13 and fixed with an adhesive (for example by epoxy adhesive) or with a casting material and thermally connected to the inverter housing 13.

An EMC shielding wall (side wall 30) is integrated into the inverter covering (covering 27) and provided with an EMC seal 28. After the cover 29 has been closed, the EMC filter 1 and the DC input connector are protected from electromagnetic radiation coupling.

The following is a description of various conductor structures 200 to 205 which can be used as an alternative to the conductor structure 2 described above.

Figure 3:
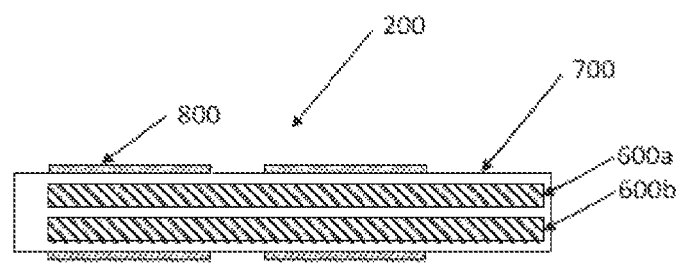
FIG. 3 shows an alternative embodiment of the conductor structure.

FIG. 3 shows an alternative embodiment of the conductor structure 200.

The conductor structure 200 is a multi-layer high-current printed circuit board or PCB200. In this conductor structure 200, multiple thick conducting layers 600*a*, 600*b*, two of which are shown by way of example in FIG. 3, are embedded between an insulating printed circuit board material 700 isolated from each other. These conducting layers 600*a*, 600*b* can include copper. Preferably, thin conducting layers 800 can be arranged on the outer surfaces of the printed circuit board material 700 in addition to the conducting layers 600*a*, 600*b* arranged or embedded on the inside. These thin conducting layers 800 can include copper.

Figure 4:
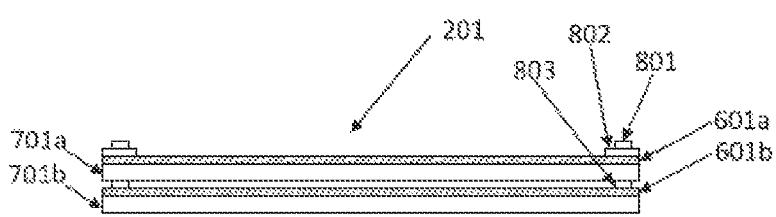
FIG. 4 shows a further alternative embodiment of the conductor structure.

FIG. 4 shows a further alternative embodiment of the conductor structure 201.

The conductor structure 201 has two or more single-layer printed circuit boards. In this conductor structure 201, there is a distance between single-layer printed circuit boards, which have a conducting layer 601*a* and an insulating printed circuit board material 701*a* or a conducting layer 601*b* and an insulating printed circuit board material 701*b*, to maintain an air gap. The distance is ensured by a spacer 803. The printed circuit boards 601*a*, 601*b* are fastened to one another, for example by means of a screw 801, which is electrically insulated from at least one of the conducting layers 601*a*, 601*b* by means of an insulation 802.

Figure 5:
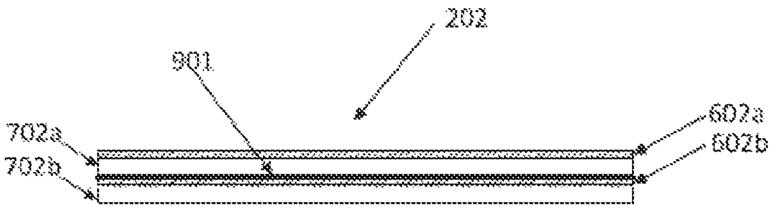
FIG. 5 shows a further alternative embodiment of the conductor structure.

FIG. 5 shows a further alternative embodiment of the conductor structure 202.

The conductor structure 202 has two or more single-layer printed circuit boards. In this conductor structure 202, an adhesive layer 901 is arranged between single-layer circuit boards which have a conducting layer 602*a* and an insulating circuit board material 702*a*, or a conducting layer 602*b* and an insulating circuit board material 702*b*, to fasten the circuit boards to one another.

Figure 6:
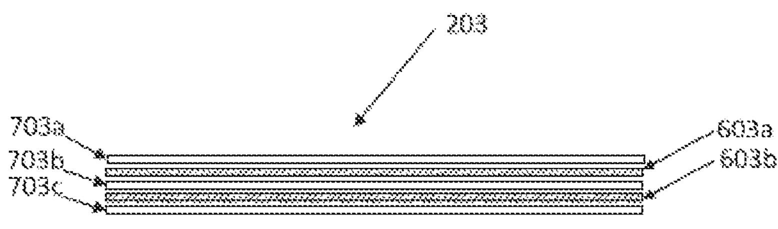
FIG. 6 shows a further alternative embodiment of the conductor structure.

FIG. 6 shows a further alternative embodiment of the conductor structure 203.

The conductor structure 203 has multiple conducting layers 603*a*, 603*b* and insulation layers 703*a*, 703*b*, 703*c* stacked one on top of the other. The stacking is such that one of the conducting layers 603*a*, 603*b* and one of the insulation layers 703*a*, 703*b*, 703*c* alternate in each case. The number of conducting layers 603*a*, 603*b* and insulating layers 703*a*, 703*b*, 703*c* is not limited to the number shown in FIG. 6. The conducting layers 603*a*, 603*b* and insulating layers 703*a*, 703*b*, 703*c* stacked one on another are not laminated to each other and are not fixedly bonded to each other.

Figure 7:
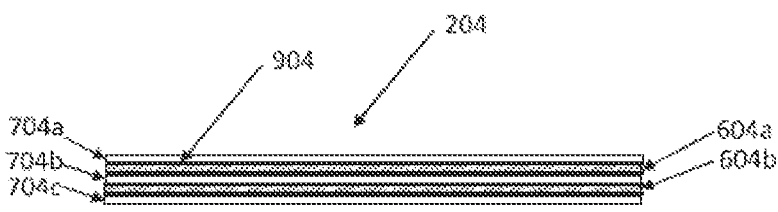
FIG. 7 shows a further alternative embodiment of the conductor structure.

FIG. 7 shows a further alternative embodiment of the conductor structure 204.

The conductor structure 204 has multiple conducting layers 604*a*, 604*b* and insulation layers 704*a*, 704*b*, 704*c* stacked one on top of the other. The stacking is such that one of the conducting layers 604*a*, 604*b* and one of the insulation layers 704*a*, 704*b*, 704*c* alternate in each case. The number of conducting layers 604*a*, 604*b* and insulating layers 704*a*, 704*b*, 704*c* is not limited to the number shown in FIG. 7. The stacked conducting layers 604*a*. 604*b* and insulating layers 704*a*, 704*b*, 704*c* are bonded together by respective adhesive layers 904 between respective adjacent layers.

Figure 8A:
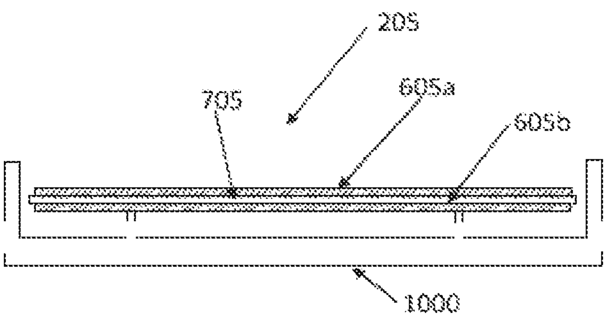
FIGS. 8*a* to 8*c* show a further alternative configuration of the conductor structure.
Figure 8B:
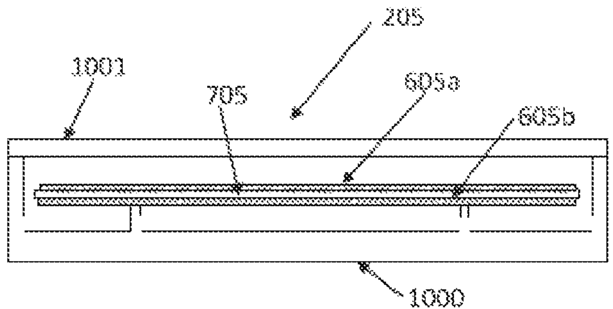
Figure 8C:
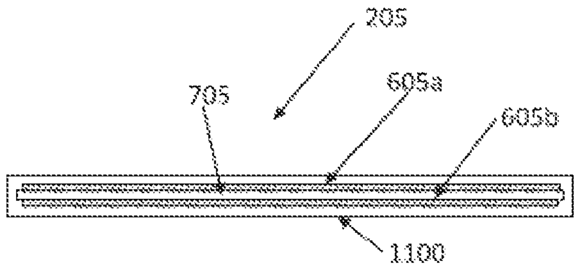

FIGS. 8*a* to 8*c* show a further alternative configuration of the conductor structure 205. More precisely, FIG. 8*a* and FIG. 8*b* show method steps for producing the conductor structure 205 shown in FIG. 8*c*.

As shown in FIG. 8*a*, multiple conducting layers 605*a*, 605*b* and at least one insulation layer 705 are stacked one on top of the other. The stacking is such that one of the conducting layers 605*a*, 605*b* and the at least one insulation layer 705 alternate. The number of conducting layers 605*a*, 605*b* and insulating layer 705 is not limited to the number shown in FIGS. 8*a* to 8*c*. The conducting layers 605*a*, 605*b* and insulation layer 705 stacked one on top of the other are arranged in a molding form 1000.

As shown in FIG. 8*b*, the molding form is closed with a closure or cover. A molding material is placed in the molding mold 1000. After the molding material has hardened, the conductor structure 205 is removed from the molding form.

As shown in FIG. 8*c*, the result is the conductor structure 205 surrounded by the molding material 1100, such as an epoxy material.

LIST OF REFERENCE SYMBOLS

- 1 EMC filter element
- 2 Conductor structure
- 3*a* First capacitor
- 3*b* Second capacitor
- 4*a* First inductor
- 4*b* Second inductor
- 5 Laminated busbar
- 6*a* First conducting layer
- 6*b* Second conducting layer
- 7 Insulation film
- 8*a* First core
- 8*b* Second core
- 9 Power supply
- 10*a* First connection
- 10*b* Second connection
- 11 Inverter unit
- 12 Capacitor arrangement
- 13 Housing
- 14 Region fixed to a housing
- 15 Layer
- 16 Power input
- 17 Power output
- 18 Upper side
- 19 Underside
- 20 Power electronics module
- 21 First electronic component
- 22 Second electronic component
- 23 Third electronic component
- 24 Current sensor
- 25 Discharge resistor
- 26 Condenser
- 27 Covering
- 28 EMC filter element
- 29 Cover
- 30 Side wall
- 31 End face
- 32 Sealing tape
- 33 Dividing line
- 34 Adhesive connection
- 35 Busbar
- 36 Weld point
- 200 Conductor structure
- 600*a* Conducting layer
- 600*b* Conducting layer
- 700 Printed circuit board material
- 800 Thin conducting layer
- 201 Conductor structure
- 601*a* Conducting layer
- 601*b* Conducting layer
- 701*a* Printed circuit board material
- 701*b* Printed circuit board material
- 801 Screw
- 802 Insulation
- 803 Spacer
- 202 Conductor structure
- 602*a* Conducting layer
- 602*b* Conducting layer
- 702*a* Printed circuit board material
- 702*b* Printed circuit board material
- 901 Adhesive layer
- 203 Conductor structure
- 603*a* Conducting layer
- 603*b* Conducting layer
- 703*a* Printed circuit board material
- 703*b* Printed circuit board material
- 703*c* Printed circuit board material
- 204 Conductor structure
- 604*a* Conducting layer
- 604*b* Conducting layer
- 704*a* Printed circuit board material
- 704*b* Printed circuit board material
- 704*c* Printed circuit board material
- 904 Adhesive layer
- 205 Conductor structure
- 605*a* Conducting layer
- 605*b* Conducting layer
- 705 Insulation layer
- 1000 Molding form
- 1001 Cover
- 1100 Molding material

The invention claimed is:

1. An EMC filter device for power electronics of an electric machine, comprising:
- an electrical conductor structure having two separate conducting layers;
- an inductor interacting with the electrical conductor structure; and
- a plurality of additional electronic components fastened to the electrical conductor structure, wherein one of the electronic components is designed as at least one of a current sensor and a discharge resistor.

2. The EMC filter device according to claim 1, wherein each of the electronic components are attached to the electrical conductor structure in a materially bonded manner.

3. The EMC filter device according to claim 1, wherein one of the electronic components is designed as a capacitor.

4. The EMC filter device according to claim 1, wherein the inductor has a core and the conductor structure is inserted through the core.

5. The EMC filter device according to claim 1, wherein the plurality of additional electrical components include a capacitor, the current sensor, and the discharge resistor.

6. A power electronics module for an electric machine, comprising:
- a capacitor arrangement; and
- an EMC filter device electrically connected to the capacitor arrangement, the EMC filter device including:
  - an electrical conductor structure having two separate conducting layers;
  - an inductor interacting with the electrical conductor structure; and
  - a plurality of additional electronic components fastened to the electrical conductor structure, wherein the electrical conductor structure is fastened to a region fixed to a housing of an inverter unit.

7. The power electronics module according to claim 6, wherein a plurality of capacitors of the capacitor arrangement are each fastened to one of an upper side or an underside of the electrical conductor structure.

8. The power electronics module according to claim 6, wherein each of the electronic components are attached to the electrical conductor structure in a materially bonded manner.

9. The power electronics module according to claim 6, wherein one of the electronic components is designed as a capacitor, the capacitor being separate from the capacitor arrangement.

10. The power electronics module according to claim 6, wherein the inductor has a core and the conductor structure is inserted through the core.

11. A power electronics module for an electric machine, comprising:

a capacitor arrangement; and an EMC filter device electrically connected to the capacitor arrangement, the EMC filter device including:

an electrical conductor structure having two separate conducting layers;

an inductor interacting with the electrical conductor structure; and a plurality of additional electronic components fastened to the electrical conductor structure, wherein a current input of the power electronics module is formed directly by the electrical conductor structure, and a current output of the power electronics module is formed by the capacitor arrangement.

12. A power electronics module for an electric machine, comprising:

a capacitor arrangement; and an EMC filter device electrically connected to the capacitor arrangement, the EMC filter device including:

an electrical conductor structure having two separate conducting layers;

an inductor interacting with the electrical conductor structure; and a plurality of additional electronic components fastened to the electrical conductor structure, wherein one of the electronic components is designed as at least one of a current sensor and a discharge resistor.

13. The power electronics module according to claim 12, wherein the plurality of additional electrical components include a capacitor, the current sensor, and the discharge resistor.

14. A power electronics module for an electric machine, comprising:

a capacitor arrangement; and an EMC filter device electrically connected to the capacitor arrangement, the EMC filter device including:

an electrical conductor structure having two separate conducting layers;

an inductor interacting with the electrical conductor structure; and a plurality of additional electronic components fastened to the electrical conductor structure, wherein the electrical conductor structure includes:

a first single-layer printed circuit board having one of the conducting layers and an insulating printed circuit board;

a second single-layer printed circuit board having the other of the conducting layers and a further insulating printed circuit board;

a spacer arranged between the first single-layer printed circuit board and the second single layer-printed circuit board; and an adhesive layer between provided in the spacer between the first single-layer printed circuit board and the second single layer-printed circuit board.

* * * * *